United States Patent [19]

Olsen et al.

[11] 4,429,395
[45] Jan. 31, 1984

[54] SEMICONDUCTOR LASER

[75] Inventors: Gregory H. Olsen, East Windsor, N.J.; Thomas J. Zamerowski, Yardley, Pa.

[73] Assignee: RCA Corporation, New York, N.Y.

[21] Appl. No.: 268,915

[22] Filed: Jun. 1, 1981

[51] Int. Cl.³ .............................................. H01S 3/19
[52] U.S. Cl. ......................................... 372/45; 357/17
[58] Field of Search ....................... 372/44, 45, 46, 48; 357/17

[56] References Cited

U.S. PATENT DOCUMENTS

| 3,701,047 | 10/1972 | Caplan et al. | 331/94.5 |
| 3,753,801 | 8/1973 | Lockwood et al. | 148/171 |
| 4,029,542 | 6/1977 | Swartz | 156/649 |
| 4,092,659 | 5/1978 | Ettenberg | 357/18 |
| 4,116,733 | 9/1978 | Olsen et al. | 148/175 |
| 4,178,564 | 12/1979 | Ladany et al. | 331/94.5 H |
| 4,185,256 | 1/1980 | Scifres et al. | 331/94.5 H |
| 4,215,319 | 7/1980 | Botez | 331/94.5 H |
| 4,347,486 | 8/1982 | Botez | 372/46 |

FOREIGN PATENT DOCUMENTS

| 26062 | 1/1981 | European Pat. Off. . |
| 1587008 | 3/1981 | United Kingdom . |

OTHER PUBLICATIONS

Pearsall et al., "Efficient Lattice-Matched Double-Heterostructure LED's at 1.1 μm from $Ga_xIn_{1-x}As_yP_{1-y}$," *APL*, vol. 28, No. 9, May 1976, pp. 499-501.
G. H. Olsen et al., Journal of Electronic Matls., vol. 9, No. 6, 1980 InGaAsP Quaternary Alloys: Composition, Refractive Index and Lattice Mismatch.

*Primary Examiner*—James W. Davie
*Attorney, Agent, or Firm*—Birgit E. Morris; Donald S. Cohen; William J. Burke

[57] ABSTRACT

A semiconductor laser includes a body having parallel end faces and a substrate having a ridge in a major surface thereof which extends between the end surfaces, an active layer overlying the ridge and which tapers in thickness from that portion of the active layer which overlies the ridge and a confinement layer overlying the active layer. The invention also includes a method of forming a semiconductor laser which includes a substrate having a ridge thereon. The method includes the steps of coating a portion of a flat surface of the substrate with an etch resistant material, etching the surface with an anisotropic etchant thereby forming a mesa therein, removing the etch resistant material, further etching the substrate to round the mesa to form a ridge and depositing the active and confinement layers over the surface and the ridge.

9 Claims, 4 Drawing Figures

SEMICONDUCTOR LASER

The Government has rights in this invention pursuant to Contract No. DAAK70-80-C-0070 awarded by the Department of the Army.

The invention relates to a semiconductor laser having a substrate with a rounded ridge in a surface thereof extending between the end faces of the laser and a method of making this laser.

BACKGROUND OF THE INVENTION

A semiconductor laser includes a body of semiconductor material, generally composed of group III-V compounds, having a thin active layer between layers of opposite conductivity type, i.e., a layer of P-type conductivity on one side of the active layer and a layer of N-type conductivity on the other side of the active layer. Such a laser, however, typically emits light in more than one optical mode which limits its utility. Botez, in U.S. Pat. No. 4,215,319 issued July 29, 1980 and entitled SINGLE FILAMENT SEMICONDUCTOR LASER, has disclosed a laser having a stable, single mode, output light beam. The control over the output light beam from this laser arises from the tapering in thickness of the layers. This laser is prepared by deposition of the confinement and active layers onto a substrate having a pair of substantially parallel grooves therein. The tapering is caused by the difference in growth rate of the layers over a land between the grooves and over the grooves when the layers are prepared by liquid or vapor phase epitaxy techniques.

However, if the layers are deposited on an indium phosphide substrate having such a pair of parallel grooves, using either liquid phase or vapor phase epitaxy, flat, planar surfaces are observed with the grooves filling faster than the flat substrate portions until a continuous, smooth surface is obtained. This growth habit of InP limits the utilization of the structure disclosed by Botez for lasers composed of InP and related alloys. It would be desirable to have a laser composed of InP and related alloys which exhibits the tapered layer structure characteristic of the laser disclosed by Botez.

SUMMARY OF THE INVENTION

We have discovered that when a laser is formed on a substrate having a ridge therein, the deposited layers have curved surfaces with the desired taper in thickness. The semiconductor laser of the invention includes a body of semiconductor material having a pair of end surfaces and a substrate having one or more ridges therein extending between the end faces. An active layer overlies the surface of the substrate and the ridges and tapers in thickness in the lateral direction (a direction in the plane of the surface of the substrate and perpendicular to the axis of the ridges). A confinement layer overlies the active layer.

The method of forming this laser includes the steps of depositing a layer of an etch resistant material on a portion of the substrate, etching the uncovered portions of the surface of the substrate, removing the etch resistant material and leaving a mesa in the substrate surface, further etching the surface thereby forming a ridge therein and depositing the active and confinement layers sequentially over the surface of the substrate and the ridge.

DETAILED DESCRIPTION OF THE INVENTION

Figure 1:
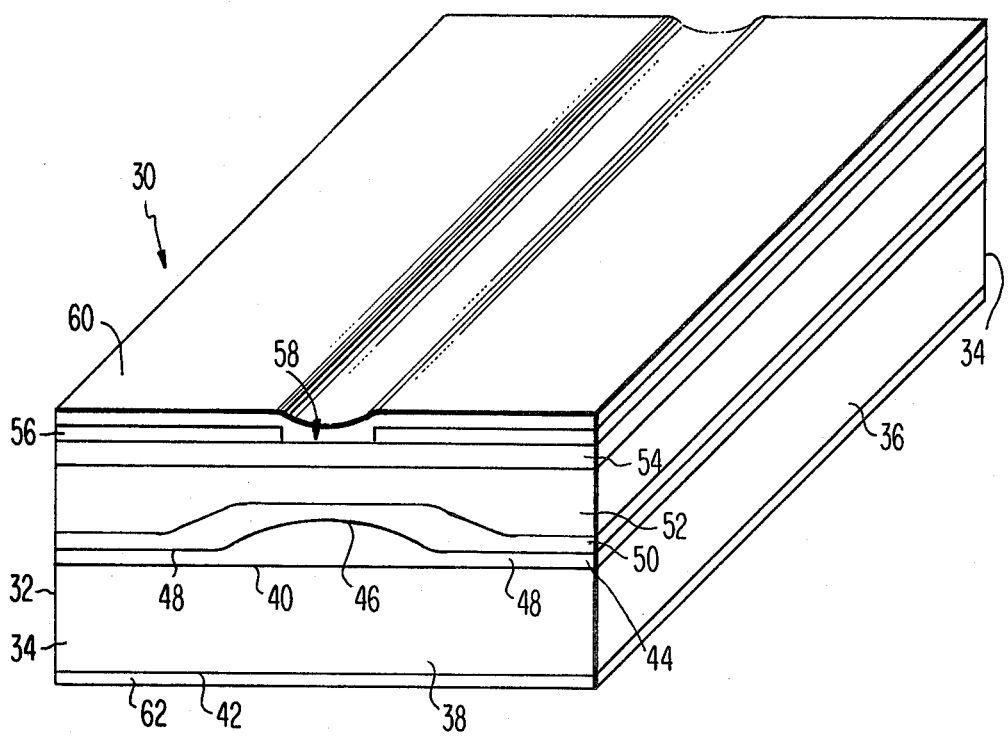
FIG. 1 is a schematic illustration of a perspective view of a semiconductor laser of the invention.

Referring to FIG. 1, a semiconductor laser 30 includes a semiconductor body 32 having spaced parallel end faces 34, at least one of which is partially transmissive of light at the wavelength of the output laser beam, and a pair of side surfaces 36 extending between the end faces 34. The semiconductor body 32 includes a substrate 38 having a pair of opposed major surfaces 40 and 42. A buffer layer 44 overlies the major surface 40 and has a rounded ridge 46 in a surface 48 thereof which extends between the end faces 34 of the body 32. An active layer 50 overlies the ridge 46 and the surface 48 of the buffer layer 44 and tapers in increasing thickness in the lateral direction from the portion thereof over the peak of the ridge 46 toward the base of the ridge. A confinement layer 52 overlies the active layer 50 and a capping layer 54 overlies the confinement layer 52. An electrically insulating layer 56 overlies the capping layer 54 and has an opening extending therethrough in the form of a stripe 58 which is over the ridge 46 in the buffer layer 44. A first electrically conducting layer 60 overlies the electrically insulating layer 56 and the surface of the capping layer 54 in the region of the stripe 58. A second electrically conducting layer 62 overlies the second major surface 42 of the substrate 38. The first and second electrically conducting layers 60 and 62 respectively form the electrical contacts to the body 32.

Figure 2:
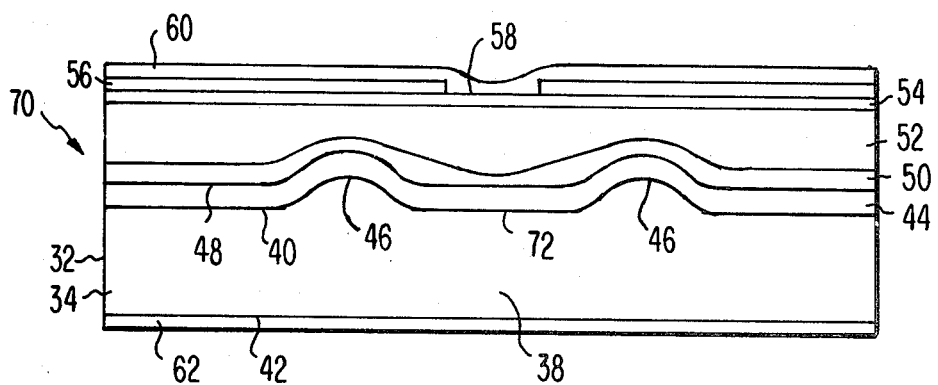
FIG. 2 is a schematic illustration of a cross sectional view of a second embodiment of the semiconductor laser of the invention.

Referring to FIG. 2 the identification of the elements common to a semiconductor laser 70 and the semiconductor laser 30 of FIG. 1 is the same. The semiconductor laser 70 differs from the semiconductor laser 30 in that there are a pair of rounded ridges 46 in the substrate 38 with the buffer layer 44 overlying the substrate and ridges. The active layer 50 then overlies the buffer layer 44 and tapers in increasing thickness in the lateral direction toward the bases of the ridges from the portion thereof over the center of a land 72 between the ridges 46.

The substrate 38 is typically composed of a binary group III-V compound or an alloy of such compounds having a surface 40 which is parallel to the (100) or (110) crystallographic plane. The substrate may be slightly misoriented from one of these orientations but preferably either a (100) or (110) plane is used. However, it is to be understood that other substrate orientations may also be used. In the selection of the substrate and the layers deposited thereon, it is desirable that the layers be lattice matched to the substrate. Preferably the substrate is composed of N-type InP.

The buffer layer 44 is typically composed of the same material as the substrate and is used to provide a high quality surface upon which the overlying layers can be deposited. Typically this layer is between about 3 and about 10 micrometers thick. If the ridges 46 are in the substrate 38 a buffer layer may be interposed between the substrate 38 and active layer 50.

The rounded ridges 46 are shown in FIGS. 1 and 2 as being in the buffer layer 44 and the substrate 38 respectively. The ridges may be between about 5 and about 20 micrometers wide at their base and between about 0.2 and about 10 micrometers in height. The height and width are chosen so as to provide the desired curvature of the layers deposited thereon. If more than one ridge is present, the spacing between the ridges as well as the height and width of the individual ridges is chosen so as to provide the desired curvature of the layers deposited thereon. Typically, the center-to-center spacing of the ridges is between about 10 and about 100 micrometers.

Figure 3:
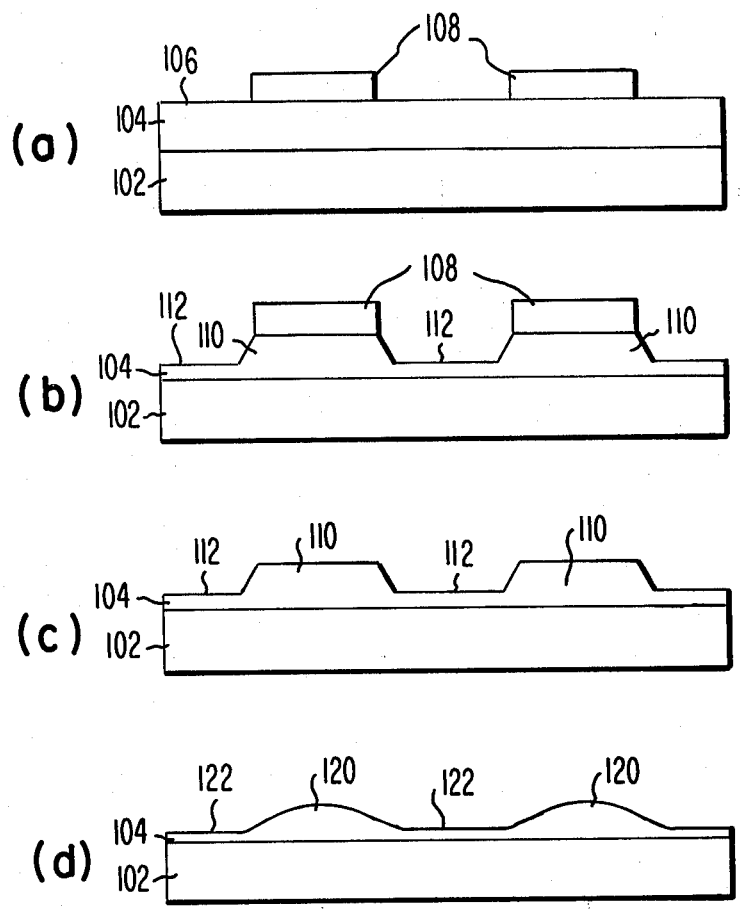
FIG. 3 is a schematic illustration of the steps of the method of the invention.

The ridges may be formed using the sequence of steps shown in FIG. 3. In FIG. 3(a) the substrate 102 is coated with a buffer layer 104. Portions of the surface 106 of the buffer layer 104 are then coated with a masking layer 108 of etch resistant material such as an oxide of silicon, using standard photolithographic and deposition techniques. The surface 106 is then etched with an anisotropic etchant such as 0.1 to 1.0 percent bromine in methanol which etches the exposed portion of the buffer layer 104 and forms mesas 110 in the surface 112 of the buffer layer 104 as shown in FIG. 3(b). The masking layer 108 is then removed leaving the mesas 110 and the surface 112 as shown in FIG. 3(c). The mesas 110 and surface 112 are then further etched using the same or a different etchant to round off the mesas thereby forming the rounded ridges 120 in the surface 122 of the buffer layer 104 as shown in FIG. 3(d). The active, confinement and capping layers are then sequentially deposited over the ridges 120 and surface 122. It is clear that the ridges could equally well have been formed in the substrate itself followed by the sequential deposition of the layers.

The various epitaxial layers may be deposited on the substrate 38 of FIG. 1 using techniques of liquid phase epitaxy such as are disclosed by H. F. Lockwood et al in U.S. Pat. No. 3,753,801 entitled METHOD OF DEPOSITING EPITAXIAL SEMICONDUCTOR LAYERS FROM THE LIQUID PHASE, issued Aug. 21, 1973 and which is incorporated herein by reference. Alternatively, the layers may be deposited by vapor phase epitaxy using techniques such as are disclosed by Olsen et al in U.S. Pat. No. 4,116,733 entitled VAPOR PHASE GROWTH TECHNIQUE OF III-V COMPOUNDS UTILIZING A PRE-HEATING STEP, issued Sept. 26, 1978 and incorporated herein by reference. Using these techniques, layers which taper in thickness can be deposited since the local growth rate of an individual layer will vary with the local curvature of the surface upon which it is grown; the greater the amount of local positive curvature of the surface, the higher the local growth rate.

The active layer is typically between about 0.05 and about 2.2 micrometers thick and is preferably between about 0.1 and about 0.5 micrometer thick. This layer is either undoped or lightly P- or N-type conducting and may be composed of an InGaAsP or InGaAs alloy where the relative concentration of the elements is chosen to provide an approximate lattice match to the buffer layer and an output light beam of the desired wavelength, as disclosed, for example, by Olsen et al in the Journal of Electronic Materials 9, 977 (1980).

The confinement layer 52 is typically composed of P-type InP and is between about 0.5 and about 3 micrometers thick. The capping layer 54 may be used to improve the quality of the electrical contact made to the laser 30. It is typically between about 0.2 and about 0.5 micrometer thick and is composed of InGaAsP or InGaAs having the same conductivity type as the confinement layer 52.

It is to be understood that the devices of the invention can be fabricated using other combinations of group III-V alloys.

The electrically insulating layer 56 is preferably composed of silicon dioxide which may be deposited on the capping layer 38 by pyrolytic decomposition of a silicon-containing gas, such as silane, in oxygen or water vapor. The stripe 58 is formed through the electrically insulating layer 56 down to the capping layer 54 using standard photolithographic and etching techniques and is preferably located over the ridge 46 when a single ridge is present. Alternatively, if two ridges are used, then the stripe 58 is located over the land between the ridges.

The electrically conducting layer 60 is preferably composed of titanium, platinum and gold and is deposited by sequential evaporation. One skilled in the art would realize that it is only necessary that the electrically conducting layer overlie the confinement layer in the region over the ridge 46 in a device having a single ridge.

Alternatively, the electrically insulating layer 56 may be eliminated by depositing on the confinement layer 52 a blocking layer of opposite conductivity type to the confinement layer 52 which has a region therein of the same conductivity type as the confinement layer. The electrically conducting layer 60 then may overlie the entire surface of this blocking layer. Upon application of a bias voltage to the laser 30 the p-n junction between the blocking layer and the confinement layer is reverse biased except in the region of this layer which has been converted to the same conductivity type as the confinement layer 52.

The electrically conducting layer 62 on the second major surface 42 of the substrate 38 may be formed by vacuum deposition and sintering of tin and gold.

An end face 34 of the laser 30 is typically coated with a layer of aluminum oxide or similar material having a thickness of about one half wave at the lasing wavelength. Such a layer has been disclosed by Ladany et al in U.S. Pat. No. 4,178,564 issued Dec. 11, 1979 and entitled HALF WAVE PROTECTION LAYERS ON INJECTION LASERS. The opposed end face 34 may be coated with a mirror which is reflecting at the lasing wavelength. Such as disclosed by Caplan et al in U.S. Pat. No. 3,701,047 issued Oct. 24, 1972, entitled SEMICONDUCTOR LASER DEVICES UTILIZING LIGHT REFLECTIVE METALLIC LAYERS and Ettenberg in U.S. Pat. No. 4,092,659 issued May 30, 1978 and entitled MULTI-LAYER REFLECTOR FOR ELECTROLUMINESCENT DEVICE.

Figure 4:
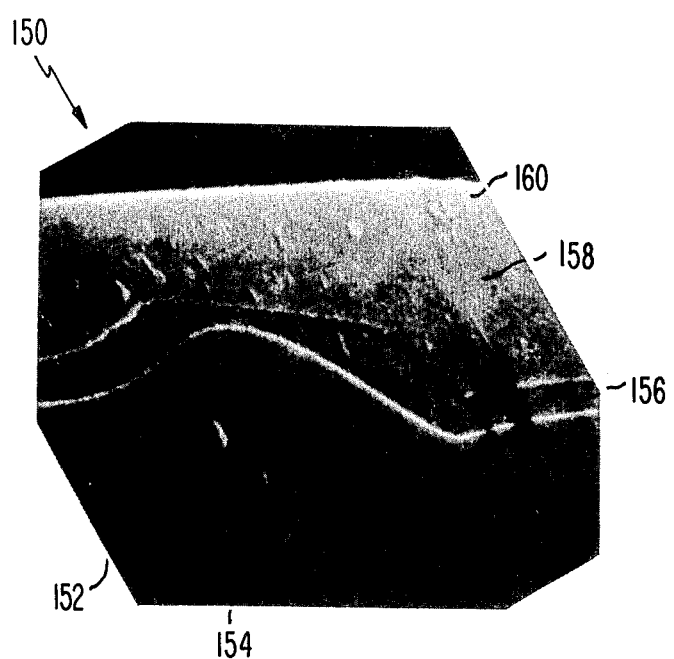
FIG. 4 is a photomicrograph of a cross section of the semiconductor laser of the invention.

Refering to FIG. 4 a photomicrograph of a cross section of a laser 150 constructed according to the principles of the invention and having the desired taper includes an InP substrate 152 having an InP buffer layer thereon which has a ridge 154 therein. An InGaAsP active layer 156 which is about 300 nanometers thick overlies the surface of the buffer layer. An InP confinement layer 158 overlies the active layer and an InGaAsP capping layer 160 overlies the confinement layer. The layers are distinguished from one another by the use of staining techniques which are well known in the art. A demarkation between the substrate 152 and the buffer layer cannot be seen because they are composed of the same material and thus the staining will affect both in the same way. The ridge 154 in the buffer layer is asymmetric because the substrate surface was slightly misoriented from the (110) direction.

We claim:

1. A semiconductor laser comprising
   a semiconductor body having two end faces, at least one of which is partially transmissive of light, and including a substrate having opposed major surfaces and a rounded ridge extending outwards in a major surface thereof and extending between the two end faces;
   an active layer overlying the substrate and increasing in thickness in the lateral direction from the portion thereof which overlies the peak of the ridge toward the base of the ridge;
   a confinement layer overlying the active layer;
   a first electrically conducting layer overlying a portion of the confinement layer over the ridge; and
   a second electrically conducting layer overlying a portion of the second major surface of the substrate;
   wherein the substrate is of one conductivity type and the confinement layer is of the opposite conductivity type and wherein the index of refraction of the active layer is greater than that of the substrate and that of the confinement layer.

2. A semiconductor laser according to claim 1 further comprising
   a capping layer overlying the confinement layer and an electrically insulating layer overlying the capping layer and having an opening extending therethrough, wherein the first electrically conducting layer overlies the capping layer in the opening in the electrically insulating layer.

3. A semiconductor laser according to claim 2 wherein the substrate includes a buffer layer and the active layer overlies the buffer layer and the buffer layer has the ridge therein.

4. A semiconductor laser according to claim 3 wherein the substrate, the buffer layer and the confinement layer are composed of InP and the active layer is composed of InGaAsP.

5. A semiconductor laser comprising
   a body composed of InP and alloys containing indium and phosphorous having two end faces at least one of which is partially transmissive of light and a substrate having opposed major surfaces and a rounded ridge projecting outwards in a major surface thereof and extending between the two end faces;
   an active layer, composed of InGaAsP, overlying the substrate and increasing in thickness from the portion thereof which overlies the peak of the ridge toward the base of the ridge;
   a confinement layer, composed of InP, overlying the active layer;
   a capping layer, composed of InGaAsP, overlying the confinement layer;
   an electrically insulating layer overlying the capping layer and having an opening therethrough;
   a first electrically conducting layer overlying the electrically insulating layer and the portion of the capping layer exposed in the opening; and
   a second electrically conducting layer overlying a portion of the second major surface of the substrate;
   wherein the substrate is of one conductivity type and the confinement layer and the capping layer of the opposite conductivity type and wherein the index of refraction of the active layer is greater than that of the substrate and that of the confinement layer.

6. A semiconductor laser comprising
   a semiconductor body having two end faces, at least one of which is partially transmissive of light, a substrate having opposed major surface and a pair of substantially parallel, rounded ridges extending outwards in a major surface thereof, said ridges extending between the two end faces and having a land therebetween;
   an active layer overlying the substrate and the ridges and increasing in thickness in the lateral direction toward the bases of the ridges from the center of the land between the ridges;
   a confinement layer overlying the active layer;
   a first conducting layer overlying a portion of the confinement layer over the center of the land between the ridges; and
   a second electrically conducting layer overlying a portion of the second major surface of the substrate;
   wherein the substrate is of one conductivity type and the confinement layer has the opposite conductivity type and wherein the index of refraction of the active layer is greater than that of the substrate and of the confinement layer.

7. A laser according to claim 6 further comprising
   a capping layer overlying the confinement layer and an electrically insulating layer overlying the capping layer and having an opening extending therethrough over the land between the ridges, wherein the first electrically conducting layer overlies the capping layer in the opening in the electrically insulating layer.

8. A semiconductor laser according to claim 7 wherein the substrate includes a buffer layer with the active layer overlying the buffer layer and wherein the ridges are in the buffer layer.

9. A semiconductor laser according to claim 8 wherein the substrate and the confinement layer are composed of InP and the active layer is composed of an InGaAsP alloy.

* * * * *